United States Patent
Lee

(10) Patent No.: US 11,763,909 B2
(45) Date of Patent: Sep. 19, 2023

(54) MEMORY AND OPERATION METHOD OF MEMORY

(71) Applicant: SK hynix Inc., Gyeonggi-do (KR)

(72) Inventor: Jeong Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 56 days.

(21) Appl. No.: 17/537,033

(22) Filed: Nov. 29, 2021

(65) Prior Publication Data
US 2023/0012825 A1    Jan. 19, 2023

(30) Foreign Application Priority Data
Jul. 19, 2021    (KR) .................. 10-2021-0094079

(51) Int. Cl.
*G11C 29/42*       (2006.01)
*G11C 29/44*       (2006.01)
*G11C 11/4094*     (2006.01)
*G11C 11/408*      (2006.01)
*G11C 11/4091*     (2006.01)
*G11C 29/12*       (2006.01)

(52) U.S. Cl.
CPC ............ *G11C 29/42* (2013.01); *G11C 11/4087* (2013.01); *G11C 11/4091* (2013.01); *G11C 11/4094* (2013.01); *G11C 29/4401* (2013.01); *G11C 2029/1204* (2013.01)

(58) Field of Classification Search
CPC ... G11C 29/42; G11C 11/4087; G11C 11/4091; G11C 11/4094; G11C 29/4401; G11C 2029/1204
See application file for complete search history.

(56) References Cited

U.S. PATENT DOCUMENTS

| | | | |
|---|---|---|---|
| 10,884,860 B2 | 1/2021 | Ware et al. | |
| 2008/0082898 A1* | 4/2008 | Nygren et al. | G11C 7/1006 714/763 |
| 2022/0156147 A1* | 5/2022 | Park | G11C 29/52 714/763 |

FOREIGN PATENT DOCUMENTS

KR   10-2017-0117272 A   10/2017

\* cited by examiner

*Primary Examiner* — Thien Nguyen
(74) *Attorney, Agent, or Firm* — IP & T GROUP LLP

(57) ABSTRACT

A method for operating a memory includes: receiving a first write command and a first write address; receiving first write data a portion of which is masked; reading first read data and a first read error correction code from a region selected based on the first write address in a cell array; detecting and correcting an error in the first read data based on the first read error correction code to produce error-corrected first read data; generating first new write data by replacing the masked portion of the first write data with a portion of the error-corrected first read data; generating a first write error correction code based on the first new write data; and writing the first new write data and the first write error correction code into the region selected based on the first write address in response to the detecting of the error.

15 Claims, 4 Drawing Sheets

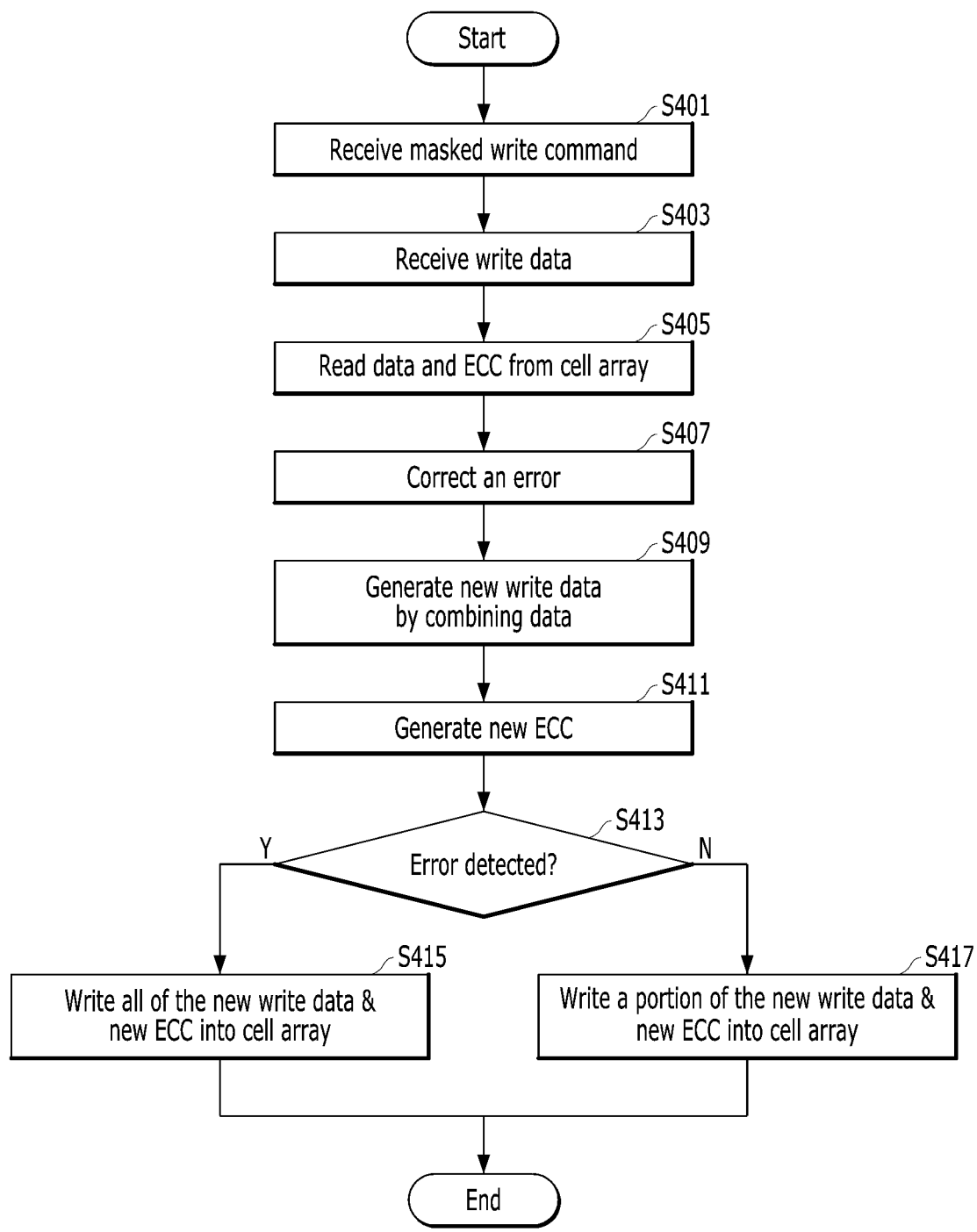

MEMORY AND OPERATION METHOD OF MEMORY

CROSS-REFERENCE TO RELATED APPLICATIONS

The present application claims priority of Korean Patent Application No. 10-2021-0094079, filed on Jul. 19, 2021, which is incorporated herein by reference in its entirety.

BACKGROUND

1. Field

Various embodiments of the present invention relate to a memory.

2. Description of the Related Art

In the early stage of a semiconductor memory device industry, there were many originally good dies on the wafers, which means that memory chips were produced with no defective memory cells through a semiconductor fabrication process. However, as the capacity of memory devices increases, it became difficult to fabricate a memory device that does not have any defective memory cell, and nowadays, it may be said that there is substantially no chance that a memory device is fabricated without any defective memory cells. To address the problem, a repair method of including redundant memory cells in a memory device and replacing defective memory cells with the redundant memory cells is being used.

As another method, an error correction circuit (ECC circuit) for correcting errors in a memory system is used to correct errors occurring in memory cells and errors occurring when data are transferred during a read operation and a write operation of the memory system.

SUMMARY

Embodiments of the present invention are directed to a technique for reducing the occurrence of errors and consumption of current during a masked write operation of a memory.

In accordance with an embodiment of the present invention, a method for operating a memory includes: receiving a first write command and a first write address; receiving first write data a portion of which is masked; reading first read data and a first read error correction code from a region selected based on the first write address in a cell array; detecting and correcting an error in the first read data based on the first read error correction code to produce error-corrected first read data; generating first new write data by replacing the masked portion of the first write data with a portion of the error-corrected first read data; generating a first write error correction code based on the first new write data; and writing the first new write data and the first write error correction code into the region selected based on the first write address in the cell array in response to the detecting of the error in the first read data.

In accordance with another embodiment of the present invention, a memory includes: a cell array; an access circuit suitable for accessing the cell array; an error correction circuit suitable for correcting an error of data based on an error correction code, the data and the error correction code being read from the cell array through the access circuit; an error correction code generating circuit suitable for generating an error correction code to be written into the cell array based on data to be written into the cell array; a data transmission/reception circuit suitable for transmitting and receiving data; a data combining circuit suitable for generating data to be written into the cell array by combining data transmitted from the cell array through the access circuit and the error correction circuit with data received through the data transmission/reception circuit in a masked-write operation; a mask circuit suitable for receiving mask information and generating mask signals indicating a masked portion to be masked by the access circuit, the masked portion being included in the data received through the data transmission/reception circuit; and a mask blocking circuit suitable for deactivating all of the mask signals and transmitting the deactivated mask signals to the access circuit, when the error of the read data is corrected by the error correction circuit during the masked-write operation.

In accordance with yet another embodiment of the present invention, a memory includes: a cell array; an access circuit suitable for accessing the cell array; an error correction code generating circuit suitable for generating an error correction code; an error correction circuit suitable for detecting and correcting an error of data based on the error correction code, the data and the error correction code being read from the cell array through the access circuit; and a data combining circuit suitable for generating, during a masked-write operation, new write data by replacing a masked portion of write data with a portion of the read data transmitted from the error correction circuit. Wherein during the masked-write operation: the error correction code generating circuit is further suitable for generating a write error correction code based on the new write data. Wherein the access circuit accesses the cell array by writing the new write data and the write error correction code into the cell array when the error correction circuit corrects the error of the read data and by writing a remaining portion other than the masked portion within the write data and the write error correction code into the cell array when the error correction circuit detects no error of the read data.

In accordance with yet another embodiment of the present invention, a method for operating a memory includes: generating modified write data by replacing a first portion of original write data with at least a portion of data read from a selected region of a memory, the original write data comprising the first portion and a second portion; generating an error correction code for the modified write data; and storing, in the selected region, the error correction code and the second portion.

In accordance with yet another embodiment of the present invention, a method for operating a memory includes: generating modified write data by replacing a portion of original write data with at least a portion of data read from a selected region of a memory and error-corrected; generating an error correction code for the modified write data; and storing, in the selected region, the error correction code and the modified write data.

BRIEF DESCRIPTION OF THE DRAWINGS

FIG. 4 is a flowchart describing a masked-write operation of the memory 100 shown in FIG. 1.

DETAILED DESCRIPTION

Figure 1:
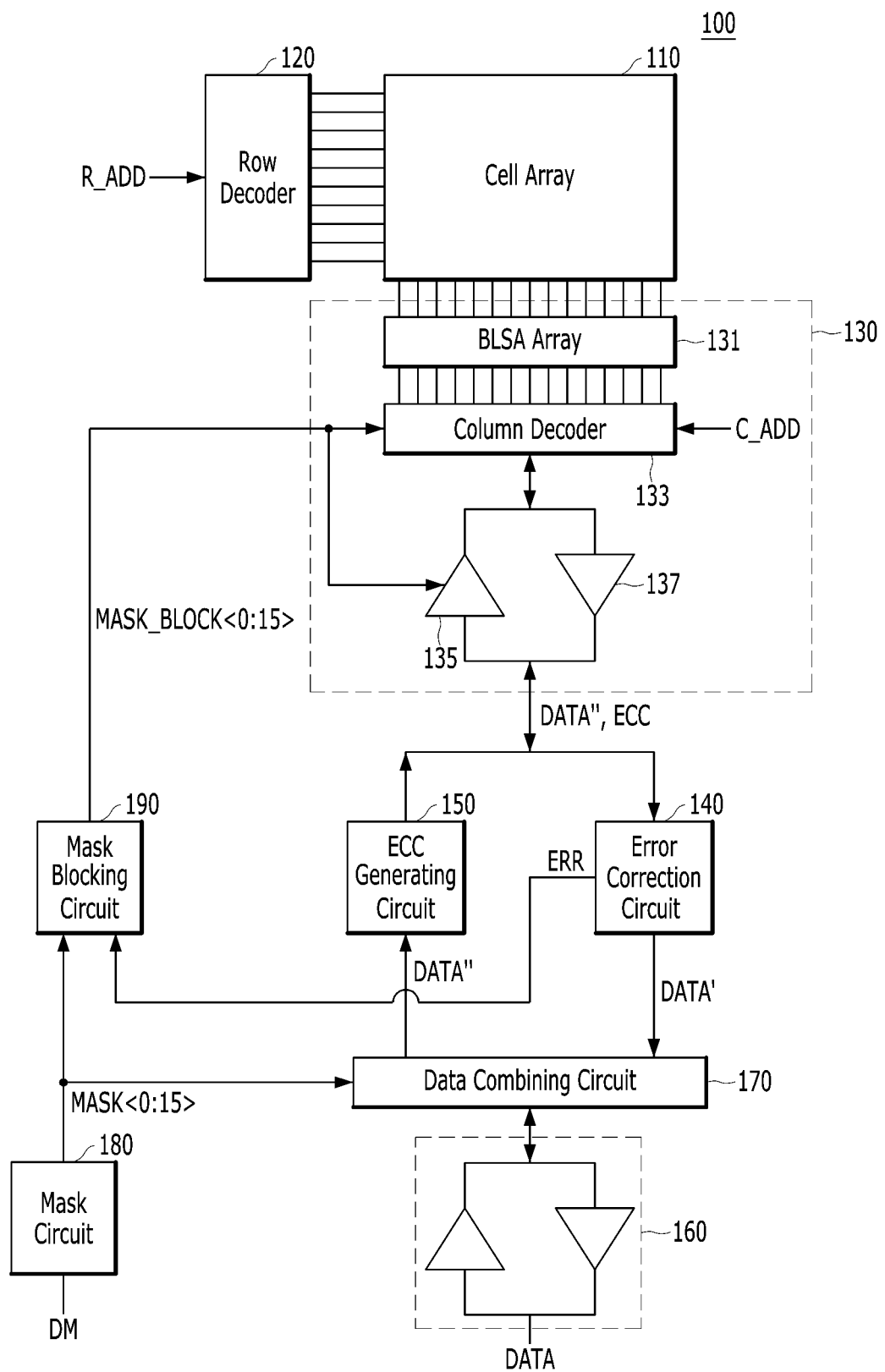
FIG. 1 is a block diagram illustrating a memory 100 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory 100 in accordance with an embodiment of the present invention.

Referring to FIG. 1, the memory 100 may include a cell array 110, a row decoder 120, an access circuit 130, an error correction circuit 140, an error correction code (ECC) generating circuit 150, and a data transmission/reception circuit 160, a data combining circuit 170, a mask circuit 180, and a mask blocking circuit 190.

The cell array 110 may include a plurality of memory cells that are arranged in a plurality of rows and a plurality of columns. In the cell array 110, the row lines that are arranged in a row direction may be referred to as word lines, and the column lines that are arranged in a column direction may be also referred to as bit lines. Each of the memory cells may be coupled to one among the row lines and one among the column lines.

The row decoder 120 may select one row in the cell array 110 by decoding a row address R_ADD. The row decoder 120 may activate a word line which is selected based on the row address R_ADD among the word lines of the cell array 110. The row decoder 120 may activate a word line which is selected based on a row address during an active operation and deactivate the activated word line during a precharge operation.

The access circuit 130 may access the cell array 110. The access circuit 130 may read data DATA" and an error correction code ECC from the cell array 110 during a read operation, and write the data DATA" and the error correction code ECC into the cell array 110 during a write operation. The access circuit 130 may include a bit line sense amplifier array 131, a column decoder 133, a plurality of write drivers 135, and a plurality of local sense amplifiers 137.

The bit line sense amplifier array 131 may include a plurality of bit line sense amplifiers, and the bit line sense amplifiers may sense and amplify the data of the cell array 110. The bit line sense amplifiers may be provided for each column to sense and amplify the data of a column corresponding thereto.

The column decoder 133 may decode a column address C_ADD to select columns to be accessed in the cell array 110. The column decoder 133 may select bit line sense amplifiers to be accessed, that is, to or from which data is to be input or output, among the bit line sense amplifiers of the bit line sense amplifier array 131, and couple the write drivers 135 and the local sense amplifiers 137. The column decoder 133 may select a plurality of columns. For example, during a one-time read operation and a one-time write operation, 128-bit data DATA" and an 8-bit error correction code ECC may be input and output to and from the cell array 110, and the column decoder 133 may select 136 =128+8 columns for inputting and outputting the data DATA" and the error correction code ECC.

A portion of the column decoder 133 may be activated/deactivated based on the mask signals MASK_BLOCK<0:15> transmitted from the mask blocking circuit 190. To be specific, a predetermined portion of the column decoder 133 corresponding to the activated mask signal among the mask signals MASK_BLOCK<0:15> may be deactivated such that the data of the predetermined portion are not transmitted from the write drivers 135 to the bit line sense amplifier array 131. For example, when the mask signal MASK_BLOCK<0> is activated, the corresponding portion of the column decoder 133 may be deactivated such that the 8 bits of first to eighth bits among the 128-bit data DATA" may not be transmitted from the write drivers 135 to the bit line sense amplifier array 131. Similarly, when a mask signal MASK_BLOCK<1> is activated, the corresponding portion of the column decoder 133 may be deactivated such that the 8 bits of ninth to $16^{th}$ bits among the 128-bit data DATA" may not be transmitted from the write drivers 135 to the bit line sense amplifier array 131.

The write drivers 135 may transmit the data DATA" and the error correction code ECC to the bit line sense amplifiers that are selected by the column decoder 133. Since it is described herein that the data DATA" is of 128 bits and the error correction code ECC is of 8 bits, the number of the write drivers 135 may be 136. The write drivers 135 may be activated/deactivated in response to the mask signals MASK_BLOCK<0:15> transmitted from the mask blocking circuit 190. For example, when the mask signal MASK_BLOCK<0> is activated, the 8 write drivers for transmitting the 8 bits of the first to eighth bits among the 128-bit data DATA" may be deactivated. Similarly, when a mask signal MASK_BLOCK<2> is activated, the 8 write drivers for transmitting the 8 bits of $17^{th}$ to $24^{th}$ bits among the 128-bit data DATA" may be deactivated. In this disclosure, the 8 bits of first to eighth bits among the 128-bit data DATA" (in the example that the mask signal MASK_BLOCK<0> is activated) or the 8 bits of $17^{th}$ to $24^{th}$ bits among the 128-bit data DATA" (in the example that the mask signal MASK_BLOCK<2> is activated) may be referred to as a masked portion of the data DATA" as new write data or data DATA as write data, which will be described later.

The local sense amplifiers 137 may receive the data DATA" and the error correction code ECC from the bit line sense amplifiers that are selected by the column decoder 133. Since it is described herein that the data DATA" is of 128 bits and the error correction code ECC is of 8 bits, the number of the local sense amplifiers 137 may be 136.

The error correction circuit 140 may correct an error of the data DATA" which is read from the cell array 110 through the access circuit 130 by using the error correction code ECC which is read from the cell array 110 through the access circuit 130. Here, correcting an error may mean searching for an error in the data DATA" based on the error correction code ECC and, when an error is detected, correcting the detected error. An error signal ERR which is output from the error correction circuit 140 may be activated when the error correction circuit 140 detects an error in the data DATA".

The error correction code generating circuit 150 may generate an error correction code ECC based on the data DATA". The error correction code generating circuit 150 may encode the data DATA" and generate an error correction code ECC for correcting an error of the data DATA". Since the error correction code generating circuit 150 may only generate an error correction code ECC and may not perform an error correction operation, the data DATA" which is input to the error correction code generating circuit 150 and the data DATA" which is output from the error correction code generating circuit 150 may be the same.

The data combining circuit 170 may be a circuit for combining data during a masked-write operation. The data combining circuit 170 may generate the data DATA" to be written into the cell array 110 by combining the data DATA' which is read from the cell array 110 and transmitted through the access circuit 130 and the error correction circuit 140 with data DATA which is received through the data transmission/reception circuit 160. The data combining circuit 170 may generate the data DATA" by replacing a masked portion of the write data DATA which is received through the data transmission/reception circuit 160 with the data DATA' which is read from the cell array 110 and transmitted through the access circuit 130 and the error correction circuit 140. The data combining circuit 170 may identify the masked portion of the write data DATA based on the mask signals MASK<0:15> transmitted from the mask circuit 180.

Since the data combining circuit 170 is a circuit used to combine data during a masked-write operation, data may bypass the data combining circuit 170 during a normal write operation and a normal read operation, which is not a masked-write operation. The data DATA and the data DATA" may be the same during a normal write operation, and the data DATA' and the data DATA may be the same during a normal read operation.

The data transmission/reception circuit 160 may transmit or receive data to or from a memory controller. The data DATA may be of multiple bits. During a write operation, the data DATA may be transmitted from the memory controller to the memory 100, and during a read operation, the data DATA may be transmitted from the memory 100 to the memory controller.

The mask circuit 180 may generate mask signals MASK<0:15> by receiving mask information DM transmitted from the memory controller. The mask signals MASK<0:15> may indicate a masked portion of the write data DATA transmitted from the memory controller during a masked-write operation.

When an error is corrected by the error correction circuit 140 during a masked-write operation, that is, when the error signal ERR is activated, the mask blocking circuit 190 may deactivate all of the mask signals MASK<0:15> and transmit the mask signals to the access circuit 130. When the error signal ERR is deactivated, the mask signals MASK<0:15> input to the mask blocking circuit 190 and the mask signals MASK_BLOCK<0:15> output from the mask blocking circuit 190 may be the same. When the error signal ERR is activated, the mask signals MASK_-BLOCK<0:15> output from the mask blocking circuit 190 may be all deactivated to '0' with no regard to the logic levels of the mask signals MASK<0:15>.

Figure 2:
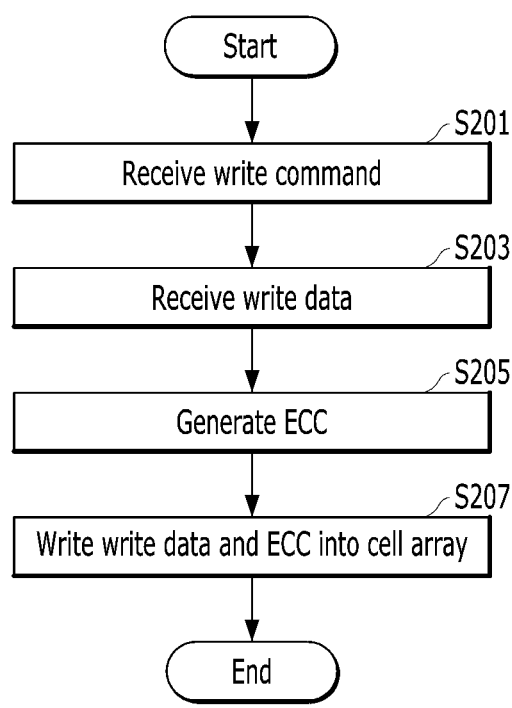
FIG. 2 is a flowchart describing a normal write operation of the memory 100 shown in FIG. 1 in accordance with an embodiment of the present invention.

FIG. 2 is a flowchart describing a normal write operation of the memory 100 shown in FIG. 1 in accordance with an embodiment of the present invention.

Referring to FIG. 2, a normal write operation may begin as the memory 100 receives a write command which is transmitted from the memory controller and a write address which is a column address corresponding to the write command in operation S201.

The data transmission/reception circuit 160 may receive write data DATA transmitted from the memory controller in operation S203.

The write data DATA received through the data transmission/reception circuit 160 may be transmitted to the error correction code generating circuit 150, and the error correction code generating circuit 150 may generate an error correction code ECC based on the write data DATA code in operation S205. In this case, the write data DATA may bypass the data combining circuit 170. The write data DATA and the write data DATA" may be the same (DATA = DATA").

The access circuit 130 may write the write data DATA" and the error correction code ECC into the cell array 110 in operation S207.

Figure 3:
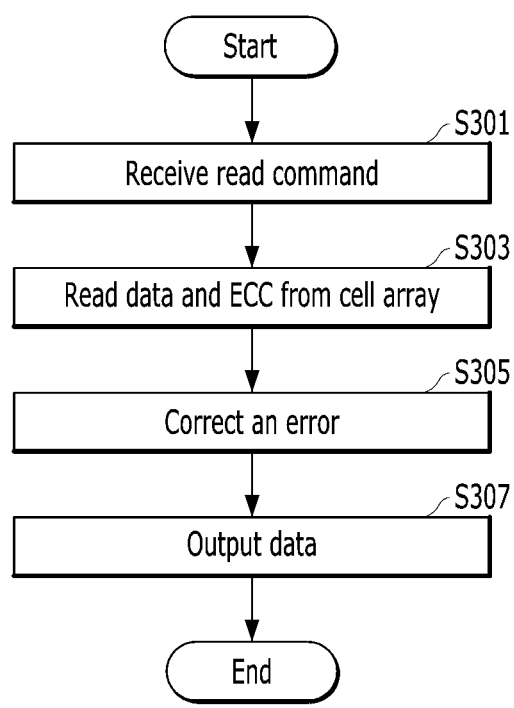
FIG. 3 is a flowchart describing a normal read operation of the memory 100 shown in FIG. 1 in accordance with an embodiment of the present invention.

FIG. 3 is a flowchart describing a normal read operation of the memory 100 shown in FIG. 1 in accordance with an embodiment of the present invention.

Referring to FIG. 3, the normal read operation may begin as the memory 100 receives a read command which is transmitted from the memory controller and a read address which is a column address corresponding to the read command in operation S301.

The access circuit 130 may read the data DATA" and the error correction code ECC from the cell array 110 in operation S303.

The error correction circuit 140 may correct an error in the data DATA" based on the error correction code ECC in operation S305. Here, correcting an error may mean detecting an error in the data DATA" and correcting the detected error.

The data DATA' which is output from the error correction circuit 140 may be transmitted to the memory controller through the data transmission/reception circuit 160 in operation S307. While the data DATA' output from the error correction circuit 140 is transmitted to the data transmission/reception circuit 160, the data DATA' may bypass the data combining circuit 170.

FIG. 4 is a flowchart describing a masked-write operation of the memory 100 shown in FIG. 1 in accordance with an embodiment of the present invention.

Referring to FIG. 4, the masked-write operation may begin as the memory 100 receives a masked-write command which is transmitted from the memory controller and a write address which is a column address corresponding to the masked-write command in operation S401.

The data transmission/reception circuit 160 may receive write data DATA transmitted from the memory controller in operation S403. A masked portion of the write data DATA may be detected based on the mask signals MASK<0:15> generated by the mask circuit 180 receiving the mask information DM.

The access circuit 130 may read data DATA" and an error correction code ECC from the cell array 110 in operation S405. The access circuit 130 may read the data DATA" and the error correction code ECC from a region selected based on a write address in the cell array 110. During a masked-write operation, the read operation may be performed because the read data DATA" is required to replace the masked portion in the write data DATA for generation of a new error correction code ECC.

The error correction circuit 140 may correct a detected error, if any, in the read data DATA" based on the error correction code ECC which is read through the access circuit 130 in operation S407. Here, correcting a detected error may include detecting an error, if any, in the read data DATA" based on the error correction code ECC.

The data combining circuit 170 may generate new write data DATA" by replacing the masked portion in the write data DATA received through the data transmission/reception circuit 160 with the read data DATA' transmitted from the error correction circuit 140 in step S409. Here, the read data DATA' transmitted from the error correction circuit 140 may be error-corrected when an error is detected and may not be error-corrected when any error is not detected. The data combining circuit 170 may detect the masked portion of the write data DATA based on the mask signals MASK<0:15> transmitted from the mask circuit 180. For example, when a mask signal MASK<1> is activated, new write data DATA" may be generated by replacing the 8 bits of the ninth to 16$^{th}$ bits among the 128-bit write data DATA with the 8 bits of the ninth to 16$^{th}$ bits among the read data DATA' transmitted from the error correction circuit 140.

The error correction code generating circuit 150 may generate a new error correction code ECC based on the new write data DATA" generated by the data combining circuit 170 in operation S411.

Subsequent operations may vary in operation S413 depending on whether an error is detected in the read data DATA" or not in the operation S407. That is, operations may be different according to whether an error signal ERR generated by the error correction circuit 140 is activated or not.

When an error is detected in the operation S407 (Y in the operation S413), the access circuit 130 may write the entire new write data DATA" generated by the data combining circuit 170 and the error correction code ECC into the cell array 110 in operation S415. The access circuit 130 may write the new write data DATA" and the error correction code ECC into a region selected based on the write address in the cell array 110. When an error is detected in the operation S407, that is, when the error signal ERR is activated, all of the mask signals MASK_BLOCK<0:15> output from the mask blocking circuit 190 may be deactivated. Thus, the access circuit 130 may write the entire new write data DATA" and the error correction code ECC into the cell array 110. When an error is detected and corrected in the operation S407, the error-corrected read data DATA' may have to be written back into the cell array 110 to reduce the error. Thus, this operation may be performed.

When no error is detected in the operation S407 (N in the operation S413), the access circuit 130 may write a remaining portion other than the masked portion within the data DATA" generated by the data combining circuit 170 and the error correction code ECC into the cell array 110 in operation S417. The access circuit 130 may write the remaining portion other than the masked portion within the data DATA" and the error correction code ECC into the region selected based on the write address in the cell array 110. When no error is detected in the operation S407, that is, when the error signal ERR is deactivated, the mask signal MASK<0:15> input to the mask blocking circuit 190 and the mask signals MASK_BLOCK<0:15> output from the mask blocking circuit 190 may be the same. Accordingly, the access circuit 130 may not write the masked portion of the data DATA" into the cell array 110 in response to the mask signal MASK_BLOCK<0:15>. For example, when a mask signal MASK_BLOCK<3> is activated, the access circuit 130 may write remaining 120 bits other than the 8 bits of 25$^{th}$ to 32$^{nd}$ bits within the 128-bit data DATA" into the cell array 110. When no error is detected in the operation S407, it means that there is no error in the data DATA" read in the operation S405, so it is not necessary to write it back into the cell array 110. Accordingly, a masking operation in which the masked portion of the data DATA" is not written into the cell array 110 may be normally performed.

The operation shown in FIG. 4 may be performed whenever a masked-write operation of the memory 100 is performed. Referring to FIG. 4, when an error is detected in the read data DATA" during a read operation performed in a masked-write operation, the entire new write data DATA" generated by the data combining circuit 170 may be written into the cell array 110 as it is to reduce the error of the memory 100. Also, when no error is detected in the read data DATA" during a read operation performed in a masked-write operation, only a remaining portion other than the masked portion within the data DATA" generated by the data combining circuit 170 may be written into the cell array 110 to reduce the current consumption of the memory 100.

According to the embodiment of the present invention, it is possible to reduce the occurrence of errors and consumption of current during a masked-write operation of the memory.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A method for operating a memory, comprising:
receiving a first write command and a first write address;
receiving first write data a portion of which is masked;
reading first read data and a first read error correction code from a region selected based on the first write address in a cell array;
detecting and correcting an error in the first read data based on the first read error correction code to produce error-corrected first read data;
generating first new write data by replacing the masked portion of the first write data with a portion of the error-corrected first read data;
generating a first write error correction code based on the first new write data; and
writing the first new write data and the first write error correction code into the region selected based on the first write address in the cell array in response to the detecting of the error in the first read data.

2. The method of claim 1, further comprising:
receiving a second write command and a second write address;
receiving second write data a portion of which is masked;
reading second read data and a second read error correction code from a region selected based on the second write address in the cell array;
determining that there is no error in the second read data based on the second read error correction code;
generating second new write data by replacing the masked portion of the second write data with a portion of the second read data;
generating a second write error correction code based on the second new write data; and
writing a remaining portion other than the masked portion within the second write data and the second write error correction code into the region selected based on the second write address in the cell array in response to the determining that there is no error in the second read data.

3. The method of claim 2, wherein each of the first write command and the second write command is a masked-write command.

4. A memory comprising:
a cell array;
an access circuit suitable for accessing the cell array;
an error correction circuit suitable for correcting an error of data based on an error correction code, the data and the error correction code being read from the cell array through the access circuit;
an error correction code generating circuit suitable for generating an error correction code to be written into the cell array based on data to be written into the cell array;
a data transmission/reception circuit suitable for transmitting and receiving data;
a data combining circuit suitable for generating data to be written into the cell array by combining data transmitted from the cell array through the access circuit and the error correction circuit with data received through the data transmission/reception circuit in a masked-write operation;
a mask circuit suitable for receiving mask information and generating mask signals indicating a masked portion to be masked by the access circuit, the masked portion being included in the data received through the data transmission/reception circuit; and
a mask blocking circuit suitable for deactivating all of the mask signals and transmitting the deactivated mask signals to the access circuit, when the error of the read data is corrected by the error correction circuit during the masked-write operation.

5. The memory of claim 4, wherein the access circuit accesses the cell array during the masked-write operation by writing into the cell array the error correction code generated by the error correction code generating circuit and a remaining portion other than the masked portion, which is indicated by the mask signals transmitted from the mask blocking circuit, within the data generated by the data combining circuit.

6. The memory of claim 4, wherein the access circuit includes:
a plurality of bit line sense amplifiers suitable for amplifying data of the cell array;
a column decoder suitable for selecting bit line sense amplifiers to be accessed among the bit line sense amplifiers in response to a column address;
a plurality of write drivers suitable for transmitting data to the bit line sense amplifiers selected by the column decoder; and
a plurality of local sense amplifiers suitable for receiving data from the bit line sense amplifiers selected by the column decoder.

7. The memory of claim 6, wherein the write drivers are activated/deactivated based on the mask signals transmitted from the mask blocking circuit.

8. The memory of claim 6, wherein a portion of the column decoder is activated/deactivated by the mask signals transmitted from the mask blocking circuit.

9. The memory of claim 6, further comprising: a row decoder suitable for selecting a row from the cell array in response to a row address.

10. A memory comprising:
a cell array;
an access circuit suitable for accessing the cell array;
an error correction code generating circuit suitable for generating an error correction code;
an error correction circuit suitable for detecting and correcting an error of data based on the error correction code, the data and the error correction code being read from the cell array through the access circuit; and
a data combining circuit suitable for generating, during a masked-write operation, new write data by replacing a masked portion of write data with a portion of the read data transmitted from the error correction circuit,
wherein during the masked-write operation:
the error correction code generating circuit is further suitable for generating a write error correction code based on the new write data, and
wherein the access circuit accesses the cell array by writing the new write data and the write error correction code into the cell array when the error correction circuit corrects the error of the read data and by writing a remaining portion other than the masked portion within the write data and the write error correction code into the cell array when the error correction circuit detects no error of the read data.

11. The memory of claim 10, further comprising: a mask circuit suitable for receiving mask information and generating mask signals indicating a masked portion of the write data, during the masked-write operation.

12. The memory of claim 11, further comprising a mask blocking circuit suitable for deactivating all of the mask signals and transmitting the deactivated mask signals to the access circuit, when the error correction circuit corrects the error in the read data during the masked-write operation.

13. The memory of claim 12, wherein the access circuit includes:
a plurality of bit line sense amplifiers suitable for amplifying data of the cell array;
a column decoder suitable for selecting bit line sense amplifiers to be accessed among the bit line sense amplifiers in response to a column address;
a plurality of write drivers suitable for transmitting data to the bit line sense amplifiers that are selected by the column decoder; and
a plurality of local sense amplifiers suitable for receiving data from the bit line sense amplifiers selected by the column decoder.

14. The memory of claim 13, wherein the write drivers are activated/deactivated based on the mask signals transmitted from the mask blocking circuit.

15. The memory of claim 13, wherein a portion of the column decoder is activated/deactivated by the mask signals transmitted from the mask blocking circuit.

* * * * *